United States Patent
Kim et al.

(10) Patent No.: US 9,657,196 B2
(45) Date of Patent: May 23, 2017

(54) SEMICONDUCTOR DEVICE CONNECTED BY ANISOTROPIC CONDUCTIVE FILM

(71) Applicant: SAMSUNG SDI CO., LTD., Yongin-si, Gyeonggi-do (KR)

(72) Inventors: Ji Yeon Kim, Suwon-si (KR); Kyoung Ku Kang, Suwon-si (KR); Kyoung Soo Park, Suwon-si (KR); Young Woo Park, Suwon-si (KR); Byeong Geun Son, Suwon-si (KR); Kyoung Hun Shin, Suwon-si (KR); Young Ju Shin, Suwon-si (KR); Kwang Jin Jung, Suwon-si (KR); Jae Sun Han, Suwon-si (KR); Ja Young Hwang, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 159 days.

(21) Appl. No.: 14/605,419

(22) Filed: Jan. 26, 2015

(65) Prior Publication Data

US 2015/0318257 A1 Nov. 5, 2015

(30) Foreign Application Priority Data

Apr. 30, 2014 (KR) ........................ 10-2014-0052959

(51) Int. Cl.
*H01B 1/00* (2006.01)
*C09J 7/00* (2006.01)
(Continued)

(52) U.S. Cl.
CPC . *C09J 7/00* (2013.01); *C09J 9/02* (2013.01); *C09J 163/00* (2013.01);
(Continued)

(58) Field of Classification Search
CPC ......... H01L 2924/0002; H01L 2924/00; H01L 2224/2919; H01L 23/488; H01L 24/29;
(Continued)

(56) References Cited

U.S. PATENT DOCUMENTS 6,699,351 B2 * 3/2004 Yamaguchi .......... C08G 59/226
156/275.5
8,034,261 B2 * 10/2011 Kim ........................ C08J 5/18
252/511

(Continued)

FOREIGN PATENT DOCUMENTS

CN 1289621 C 12/2006
CN 101429341 A 5/2009
(Continued)

OTHER PUBLICATIONS

Chinese Office Action dated Oct. 28, 2016.

*Primary Examiner* — Mark Kopec
*Assistant Examiner* — Jaison Thomas
(74) *Attorney, Agent, or Firm* — Lee & Morse, P.C.

(57) ABSTRACT

A semiconductor device connected by an anisotropic conductive film. The anisotropic conductive film includes a composition for an anisotropic conductive film including a first epoxy resin having an exothermic peak temperature of about 80° C. to about 110° C. and a second epoxy resin having an exothermic peak temperature of 120° C. to 200° C., as measured by differential scanning calorimetry (DSC). The first epoxy resin and the second epoxy resin are present in combined amount of about 30 wt % to about 50 wt % based on a total weight of the composition in terms of solid content. The second epoxy resin is present in an amount of about 60 to about 90 parts by weight based on 100 parts by weight of the first and second epoxy resins.

14 Claims, 1 Drawing Sheet

(51) Int. Cl.
*H01L 23/00* (2006.01)
*H05K 1/03* (2006.01)
*H05K 1/09* (2006.01)
*C09J 9/02* (2006.01)
*C09J 163/00* (2006.01)
*H01L 23/488* (2006.01)

(52) U.S. Cl.
CPC ............ *H01L 23/488* (2013.01); *H01L 24/29* (2013.01); *H05K 1/0306* (2013.01); *H05K 1/0353* (2013.01); *H05K 1/09* (2013.01); *C08K 2201/001* (2013.01); *C09J 2201/602* (2013.01); *C09J 2201/622* (2013.01); *C09J 2203/326* (2013.01); *C09J 2463/00* (2013.01); *H01L 2224/2919* (2013.01); *H01L 2924/0002* (2013.01); *H01L 2924/066* (2013.01); *H01L 2924/0665* (2013.01)

(58) Field of Classification Search
CPC ...... H01L 2924/066; H01L 2924/0665; C08K 2201/001; C09J 163/00; C09J 2201/602; C09J 2201/622; C09J 2203/326; C09J 2463/00

See application file for complete search history.

(56) References Cited

U.S. PATENT DOCUMENTS

| | | | |
|---|---|---|---|
| 8,043,709 B2 * | 10/2011 | Arifuku | ............... C09J 9/02 156/273.9 |
| 2003/0051807 A1 | 3/2003 | Yamaguchi et al. | |
| 2013/0126788 A1* | 5/2013 | Park | ............. H01B 1/12 252/500 |
| 2013/0154093 A1* | 6/2013 | Yu | ............. H01L 24/29 257/746 |

FOREIGN PATENT DOCUMENTS

| | | |
|---|---|---|
| CN | 103160219 A | 6/2013 |
| CN | 103160221 A | 6/2013 |
| CN | 103459453 A | 12/2013 |
| CN | 103493297 A | 1/2014 |
| JP | 2013-093315 | 5/2013 |

* cited by examiner

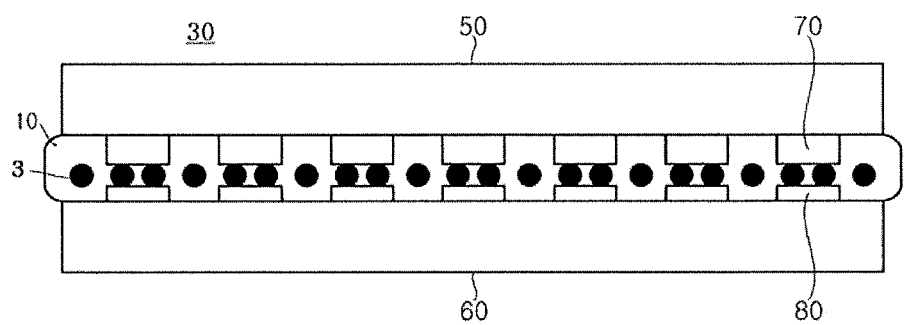

SEMICONDUCTOR DEVICE CONNECTED BY ANISOTROPIC CONDUCTIVE FILM

CROSS-REFERENCE TO RELATED APPLICATION

Korean Patent Application No. 10-2014-0052959, filed on Apr. 30, 2014, in the Korean Intellectual Property Office, and entitled: "Semiconductor Device Connected by Anisotropic Conductive Film," is incorporated by reference herein in its entirety.

BACKGROUND

1. Field

Embodiments relate to a semiconductor device connected by an anisotropic conductive film.

2. Description of the Related Art

Anisotropic conductive adhesives containing epoxy resins are used for electrical connection between electrodes on circuit boards, such as FPC (flexible printed circuit) boards, TAB (tape automated bonding) boards, PCB (printed circuit boards), glass circuit boards, and the like, while bonding the circuit boards to each other.

SUMMARY

Embodiments are directed to a semiconductor device connected by an anisotropic conductive film, wherein the anisotropic conductive film has a heat quantity variation rate of about 35% or less, as measured by differential scanning calorimetry (DSC) and calculated according to the following Equation 1, after being left at 25° C. for 170 hours.

Heat quantity variation rate (%)=[($H_0$−$H_1$)/$H_0$]×100,   [Equation 1]

where $H_0$ is heat quantity of the anisotropic conductive film as measured by DSC after being left at 25° C. for 0 hour and $H_1$ is heat quantity of the anisotropic conductive film as measured by DSC after being left at 25° C. for 170 hours.

The anisotropic conductive film may include an epoxy resin having an exothermic peak temperature of about 120° C. to about 200° C. as measured by differential scanning calorimetry (DSC).

The anisotropic conductive film may include a first epoxy resin having an exothermic peak temperature of about 80° C. to about 110° C. and a second epoxy resin having an exothermic peak temperature of about 120° C. to about 200° C., as measured by differential scanning calorimetry (DSC).

The first epoxy resin may include one or more of a propylene oxide-based epoxy resin, a hydrogenated bisphenol A epoxy resin, a cycloaliphatic epoxy resin or a naphthalene epoxy resin.

The second epoxy resin may include one or more of a bisphenol A epoxy resin, a novolac epoxy resin, a phthalate epoxy resin or a biphenyl epoxy resin.

The second epoxy resin may be present in an amount of about 60 to about 90 parts by weight based on 100 parts by weight of the first and second epoxy resins.

The anisotropic conductive film may have an DSC onset temperature of about 62° C. to about 90° C. and a peak temperature of about 85° C. to about 120° C.

The anisotropic conductive film may include a cationic curing catalyst represented by Formula 1:

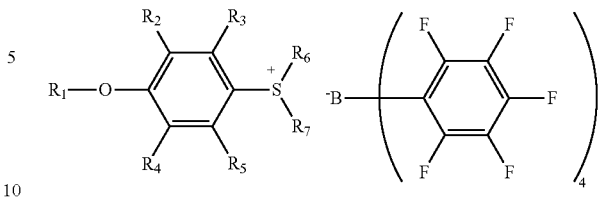

[Formula 1]

wherein $R_1$ to $R_5$ are each independently a hydrogen atom, a substituted or unsubstituted $C_1$ to $C_6$ alkyl group, an acetyl group, an alkoxycarbonyl group, a benzoyl group or a benzyloxycarbonyl group, and $R_6$ and $R_7$ are each independently an alkyl group, a benzyl group, an o-methylbenzyl group, an m-methylbenzyl group, a p-methylbenzyl group, or a naphthylmethyl group.

The anisotropic conductive film may provide a connection resistance of about 3Ω or less, as measured at 25° C. immediately after compressing and heating the anisotropic conductive film placed between a glass substrate including electrodes and an IC driver chip or IC chip at 140° C. to 160° C. under a load of 60 MPa to 80 MPa for 3 to 7 seconds, and a connection resistance of about 7Ω or less, as measured after compressing and heating the anisotropic conductive film, which has been left at 25° C. for 170 hours and then placed between the glass substrate including electrodes and the IC driver chip or IC chip, under conditions of 140° C. to 160° C. and a load of 60 MPa to 80 MPa for 3 to 7 seconds.

Embodiments are also directed to a semiconductor device connected by an anisotropic conductive film, wherein the anisotropic conductive film includes a composition including a first epoxy resin having an exothermic peak temperature of about 80° C. to about 110° C. and a second epoxy resin having an exothermic peak temperature of about 120° C. to about 200° C., as measured by differential scanning calorimetry (DSC). The first epoxy resin and the second epoxy resin are present in combined amount of about 30 wt % to about 50 wt % based on a total weight of the composition in terms of solid content. The second epoxy resin is present in an amount of about 60 to about 90 parts by weight based on 100 parts by weight of the first and second epoxy resins.

The composition may further include a binder resin, a cationic curing catalyst, and conductive particles.

The composition may further include about 30 wt % to about 70 wt % of a binder resin, about 1 wt % to about 15 wt % of a cationic curing catalyst, and about 1 wt % to about 25 wt % of conductive particles based on a total weight of the composition in terms of solid content.

The composition for anisotropic conductive films may further include a stabilizer.

The stabilizer may include one or more of a sulfonium, an amine, a phenol, a crown ester, a phosphine, and a triazine.

BRIEF DESCRIPTION OF THE DRAWING

Features will become apparent to those of skill in the art by describing in detail exemplary embodiments with reference to the attached drawing in which:

FIG. 1 illustrates a sectional view of a semiconductor device 30 according to an embodiment.

DETAILED DESCRIPTION

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

According to an embodiment, a semiconductor device is connected by an anisotropic conductive film. The anisotropic film may be formed of a composition for an anisotropic conductive film, the composition including a first epoxy resin having an exothermic peak temperature of about 80° C. to about 110° C. and a second epoxy resin having an exothermic peak temperature of about 120° C. to about 200° C., as measured by differential scanning calorimetry (DSC).

The exothermic peak temperature of the epoxy resin may be measured using a differential scanning calorimeter, for example, Model Q20 (TA Instruments) at 10° C./min after adding a cationic curing catalyst represented by Formula 1 (below) to the epoxy resin.

The first epoxy resin may have an exothermic peak temperature of about 80° C. to about 110° C., or, for example, from about 85° C. to about 105° C. The second epoxy resin may have an exothermic peak temperature of about 120° C. to about 200° C., or, for example, from about 130° C. to about 185° C.

With two types of epoxy resins having different exothermic peak temperatures, the composition for anisotropic conductive films may be rapidly cured at a low temperature by adjusting the curing rate while securing storage stability at room temperature.

The first epoxy resin may include one or more of a propylene oxide-based epoxy resin, a hydrogenated bisphenol A epoxy resin, a cycloaliphatic epoxy resin, and a naphthalene epoxy resin. For example, the first epoxy resin may be a propylene oxide-based epoxy resin or a hydrogenated bisphenol A epoxy resin.

The second epoxy resin may include one or more of a bisphenol A epoxy resin, a novolac epoxy resin, a phthalate epoxy resin and a biphenyl epoxy resin. For example, the second epoxy resin may be a bisphenol A epoxy resin (for example, JER834, Mitsubishi Chemicals, Japan) or a phthalate-based epoxy resin (for example, EX721, Nagase, Japan). The first epoxy resin and the second epoxy resin may be present in a combined amount of about 30 wt % to about 50 wt % based on a total weight of the composition in terms of solid content. The second epoxy resin may be present in an amount of 60 to 90 parts by weight based on 100 parts by weight of the first and second epoxy resins. Within this range, the composition for anisotropic conductive films may be rapidly cured at a low temperature of 100° C. to 150° C. while securing sufficient storage stability.

According to an embodiment, the second epoxy resin may be present in an amount of 20 wt % to 40 wt % based on the total amount of the composition in terms of solid content. This range of the second epoxy resin may be advantageous in terms of stability of the composition for anisotropic conductive films at room temperature.

In another embodiment, the composition for anisotropic conductive films may include a suitable cationic curing catalyst. The cationic curing catalyst may include a sulfonium-based cationic curing catalyst, for example, a sulfonium borate-based cationic curing catalyst.

Examples of the sulfonium borate-based cationic curing catalyst may include compounds represented by Formula 1:

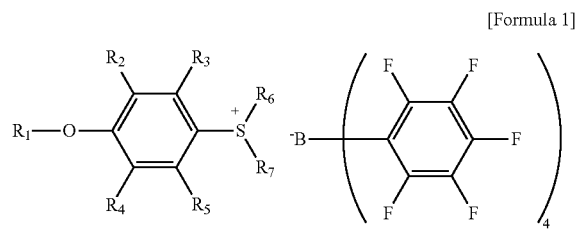

[Formula 1]

wherein $R_1$ to $R_5$ are each independently a hydrogen atom, a substituted or unsubstituted $C_1$ to $C_6$ alkyl group, an acetyl group, an alkoxycarbonyl group, a benzoyl group or a benzyloxycarbonyl group, and $R_6$ and $R_7$ are each independently an alkyl group, a benzyl group, an o-methylbenzyl group, an m-methylbenzyl group, a p-methylbenzyl group, or a naphthylmethyl group.

The cationic curing catalyst represented by Formula 1 may prevent the generation of fluorine ions in large amounts during cationic polymerization, thereby preventing or reducing the likelihood of corrosion of metal wires or connection pads. In addition, the cationic curing catalyst represented by Formula 1 may enable curing of the anisotropic conductive film at a low temperature of, for example, about 150° C. or less, or, for example, about 140° C. or less, or, for example, about 130° C., by generating cations at a lower temperature.

The sulfonium borate-based cationic curing catalyst may be present in an amount of about 1 wt % to about 15 wt %, or, for example, about 3 wt % to about 10 wt %, based on the total amount of the composition for anisotropic conductive films in terms of solid content.

According to a further embodiment, the composition for anisotropic conductive films may further include a suitable binder resin.

Examples of the binder resin may include a polyimide resin, a polyamide resin, a phenoxy resin, an epoxy resin, a polymethacrylate resin, a polyacrylate resin, a polyurethane resin, an acrylate modified urethane resin, a polyester resin, a polyester urethane resin, a polyvinyl butyral resin, a styrene-butylene-styrene (SBS) resin or an epoxylated modifications thereof, styrene-ethylene-butylene-styrene (SEBS) resins and modification thereof, an acrylonitrile butadiene rubber (NBR) or a hydrogenated compound thereof. These may be used alone or in combination thereof. A higher weight-average molecular weight of the binder resin may permit easier film formation. For example, the binder resin may have a weight-average molecular weight of about 5,000 g/mol to about 150,000 g/mol, or, for example, 10,000 g/mol to 80,000 g/mol. If the weight-average molecular weight of the binder resin is greater than about 5,000 g/mol, a film may be formed without difficulty, and if the weight-average molecular weight of the binder resin is less 150,000 g/mol, there may good compatibility with other components. The binder resin may be present in an amount of 30 wt % to 70 wt %, or, for example 30 wt % to 60 wt %, or, for example, 35 wt % to 50 wt %, based on the total amount of the composition for anisotropic conductive films in terms of solid content. Within this range, the composition may exhibit good film formation capabilities and adhesive strength.

According to an embodiment, the composition for anisotropic conductive films may further include suitable conductive particles.

Examples of the conductive particles may include metal particles such as gold (Au), silver (Ag), nickel (Ni), copper (Cu), and solder particles, carbon particles; resin particles, such as polyethylene, polypropylene, polyester, polystyrene, polyvinyl alcohol and modified resin particles thereof coated with metals, such as gold (Au), silver (Ag), nickel (Ni), palladium (Pd) or the like; and insulated conductive particles obtained by further coating insulating material or particles onto the metal-coated polymer resin particles. These may be used alone or in combination thereof.

The average particle size of the conductive particles may be varied according to the pitch of circuits to be used. For example, the average particle size may be selected within the range of about 1 µm to about 20 µm depending upon the purpose thereof. For example, the conductive particles may have an average particle size of about 1 µm to about 10 µm.

In some embodiments, the conductive particles may be present in an amount of about 1 wt % to about 30 wt %, or, for example, about 1 wt % to about 25 wt %, or, for example, about 1 wt % to about 20 wt %, based on the total amount of the composition in terms of solid content.

Within these ranges of the conductive particles, the composition may secure stable connection reliability while exhibiting low connection resistance.

According to an embodiment, the composition for anisotropic conductive films may further include a stabilizer.

Examples of the stabilizer may include a sulfonium, an amine, a phenol, a crown ester, a phosphine, a triazine, or the like. The added amount of the stabilizer may differ depending upon the properties of compounds. In some embodiments, the stabilizer may be present in an amount of about 0.01 wt % to about 5 wt %, or, for example, about 0.02 wt % to about 3 wt %, based on the total amount of the composition in terms of solid content.

According to an embodiment, the composition for anisotropic conductive films may further include a silane coupling agent.

The silane coupling agent may one or more of a polymerizable fluorine group-containing silicon compound such as vinyltrimethoxysilane, vinyltriethoxysilane, (meth)acryloxypropyltrimethoxysilane or the like; an epoxy group-containing silicon compounds such as 3-glycidoxypropyl trimethoxysilane, 3-glycidoxypropylmethyldimethoxysilane, 2-(3,4-epoxycyclohexyl)-ethyltrimethoxysilane or the like; an amine group-containing silicon compounds such as 3-aminopropyltrimethoxysilane, N-(2-aminoethyl)-3-aminopropyltrimethoxysilane, N-(2-aminoethyl)-3-aminopropylmethyldimethoxysilane or the like; or 3-chloropropyltrimethoxysilane, as examples.

The silane coupling agent may be present in an amount of about 1 wt % to about 10 wt % based on the total amount of the composition in terms of solid content.

According to an embodiment, the composition for anisotropic conductive films may further include other additives, such as a polymerization inhibitor, an antioxidant, a heat stabilizer, or the like, in order to impart additional properties to the anisotropic conductive film without deteriorating fundamental properties thereof. The additives may be present in an amount of about 0.01 wt % to about 10 wt % based on the total amount of the composition in terms of solid content.

Examples of the polymerization inhibitors may include hydroquinone, hydroquinone monomethylether, p-benzoquinone, phenothiazine or mixtures thereof. Examples of the antioxidants may include phenolic or hydroxy cinnamate substances. For example, tetrakis-(methylene-(3,5-di-t-butyl-4-hydroxy cinnamate)methane, 3,5-bis(1,1-dimethylethyl)-4-hydroxybenzenepropanoic acid thiodi-2,1-ethanediyl ester, or or like, may be used.

The anisotropic conductive film may include an anisotropic conductive adhesive layer formed of the composition for anisotropic conductive films and a release film. The release film may be removed upon preliminary pressing of the anisotropic conductive film to a first connecting member or a second connecting member. The anisotropic conductive film may be compatible with the anisotropic conductive adhesive layer.

The anisotropic conductive film may have a single layer structure including a single anisotropic conductive adhesive layer, a bilayer structure in which a non-conductive adhesive layer not containing conductive particles and a conductive adhesive layer containing conductive particles are sequentially stacked, or a triple-layer structure in which non-conductive adhesive layers are stacked on opposite sides of a conductive adhesive layer. The composition for anisotropic conductive films according to embodiments may be used as the non-conductive adhesive layer, the conductive adhesive layer, or as both the non-conductive adhesive layer and the conductive adhesive layer.

Another embodiment provides a semiconductor device connected by an anisotropic conductive film that has a heat quantity variation rate of about 35% or less, as measured by differential scanning calorimetry (DSC) and calculated according to the following Equation 1, after being left at 25° C. for 170 hours.

Heat quantity variation rate (%)=[$(H_0-H_1)/H_0$]×100,   [Equation 1]

wherein $H_0$ is heat quantity of the anisotropic conductive film as measured by DSC after being left at 25° C. for 0 hour and $H_1$ is heat quantity of the anisotropic conductive film as measured by DSC after being left at 25° C. for 170 hours.

The anisotropic conductive film may have a heat quantity variation rate of about 34% or less, or, for example, about 25% or less. The anisotropic conductive film may include an epoxy resin having an exothermic peak temperature of about 120° C. to about 200° C. as measured by differential scanning calorimetry (DSC). In some implementations, the anisotropic conductive film may include a first epoxy resin having an exothermic peak temperature of about 80° C. to about 110° C. and a second epoxy resin having an exothermic peak temperature of about 120° C. to about 200° C., as measured by DSC.

The heat quantity variation rate may be measured by a suitable method. For example, the heat quantity variation rate may be measured by the following method: after 1 mg of an anisotropic conductive film according to an embodiment is taken as a specimen, the initial (0 hour) heat quantity ($H_0$) of the specimen is measured in a temperature zone from −50° C. to 250° C. at 10° C./min using a differential scanning calorimeter, for example, Model Q20 (TA Instruments), at 25° C. Then, the film is left at 25° C. for 170 hours and heat quantity ($H_1$) of the film is measured in the same manner. Then, the heat quantity variation rate is calculated according to Equation 1.

Within this range of heat quantity variation rate, the anisotropic conductive film may exhibit good storage stability, and deterioration in adhesion or increase in connection resistance may be prevented or reduced.

Another embodiment provides a semiconductor device that has a connection resistance of about 3Ω or less, as measured at 25° C. immediately after compressing and heating the anisotropic conductive film placed between a glass substrate including electrodes and an IC driver chip or IC chip at 140° C. to 160° C. under a load of 60 MPa to 80 MPa for 3 to 7 seconds, and a connection resistance of about 7Ω or less, as measured after compressing and heating the anisotropic conductive film, which has been left at 25° C. for 170 hours and then placed between the glass substrate including electrodes and the IC driver chip or IC chip, under the same conditions.

The semiconductor device may have a connection resistance of about 2.7Ω or less, or, for example, 2.5Ω or less, as measured at 25° C. immediately after compression and heating. The semiconductor device may have a connection resistance of about 6.5Ω or less, or, for example, about 6Ω or less, as measured after being left at 25° C. for 170 hours.

The connection resistance may be measured by a suitable method used in the art. For example, the connection resistance may be measured by the following method. In this method, a glass substrate having a bump area of 1200 μm² and a 2000 Å thick indium tin oxide (ITO) circuit, and an IC chip having a bump area of 1200 μm² and a thickness of 1.5 mm are placed on upper and lower surfaces of the anisotropic conductive film, followed by compression and heating under conditions of 150° C. and 70 Mpa for 5 seconds, thereby preparing a specimen of the anisotropic conductive film. Then, initial connection resistance of the specimen is measured by a 4-probe method using a resistance tester Model 2000 multimeter (Keithley Co., Ltd.) by applying a test current of 1 mA. After being left at 25° C. for 170 hours, the anisotropic conductive film is subjected to compression and heating under the same conditions to prepare a specimen. Then, connection resistance of the specimen is measured in the same manner.

Within the above range of connection resistance, the semiconductor device may have good connection reliability.

The anisotropic conductive film may have a DSC onset temperature of about 62° C. to about 90° C. and a peak temperature of about 85° C. to about 120° C. For example, the anisotropic conductive film may have a DSC onset temperature of about 63° C. to about 87° C. and a peak temperature of about 89° C. to about 110° C. These ranges of the onset temperature and the peak temperature relate to rapid curing of the anisotropic conductive film at a low temperature of, for example, about 150° C. or less. Herein, the DSC onset temperature refers to temperature at a time point at which the slope of the DSC graph is increased for the first time due to heat generation upon measurement of heat quantity of the anisotropic conductive film depending upon temperature variation. Further, the peak temperature refers to temperature at a time point at which heat quantity reaches a maximum point in the DSC graph.

According to the embodiments, the semiconductor device may include a first connecting member including a first electrode, a second connecting member including a second electrode, and an anisotropic conductive film placed between the first connecting member and the second connecting member and connecting the first electrode to the second electrode. The anisotropic conductive film is the same as the anisotropic conductive film described in embodiments above, or an anisotropic conductive film formed of the composition for anisotropic conductive films described in embodiments herein. Suitable connecting members may be used as the first and second connecting members. The second connecting member may include, for example, a semiconductor silicon chip, an IC chip, or an IC driver chip. The first connecting member may include, for example, a glass substrate, a PCB (printed circuit board) or an fPCB (flexible printed circuit board) having electrodes formed thereon. Referring to FIG. 1, a semiconductor device 30 according to an embodiment may include a first connecting member 50 including a first electrode 70, a second connecting member 60 including a second electrode 80, and an anisotropic conductive adhesive layer 10 including conductive particles 3 as set forth above. The anisotropic conductive adhesive layer may be placed between the first connecting member 50 and the second connecting member 60 and may connect the first electrode 70 to the second electrode 80 via the conductive particles 3. Any suitable method may be used for fabricating the semiconductor device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples and Comparative Examples

Preparation of Composition for Anisotropic Conductive Film

Compositions for anisotropic conductive films of Examples 1 to 3 and Comparative Examples 1 and 2 were prepared as listed in Table 1.

TABLE 1

| Components | Product Name | Manufacturer | Example 1 | Example 2 | Example 3 | Comparative Example 1 | Comparative Example 2 |
|---|---|---|---|---|---|---|---|
| Binder resin | PKHH | Inchemrez | 40 | 40 | 40 | 40 | 40 |
| First epoxy resin | EP4000S | ADEKA | 13 | 11 | 9 | 23 | 35 |
| Second epoxy resin | JER-834 | Mitsubishi | 17 | 14 | 11 | 0 | 0 |
| | EX721 | Nagase | 5 | 10 | 15 | 12 | 0 |
| Curing catalyst | SI-B2A | Sanshin Chemical | 5 | 5 | 5 | 5 | 5 |
| Conductive particle | AUL704F | SEKISUI | 20 | 20 | 20 | 20 | 20 |
| Total | | | 100 | 100 | 100 | 100 | 100 |

Example 1

A composition for anisotropic conductive films was prepared by mixing 40 wt % of a phenoxy resin (PKHH, Inchemrez, US) dissolved in an amount of 40 vol % in a xylene/ethyl acetate azeotropic solvent, 13 wt % of a propylene oxide-based epoxy resin (EP-4000S, Adeka, Japan) having a DSC exothermic peak temperature of 90° C., 17 wt % of a bisphenol A epoxy resin (JER834, Mitsubishi Chemical, Japan) having a DSC exothermic peak temperature of 130° C., 5 wt % of a phthalate epoxy resin (EX721, Nagase, Japan) having a DSC exothermic peak temperature of 180° C., 5 wt % of a cationic curing catalyst (Si-B2A, Sanshin Chemical, Japan), and 20 wt % of conductive particles (AUL-704F, average particle size: 4 μm, SEKISUI, Japan) subjected to insulation treatment. The phenoxy resin was used as a binder system acting as a matrix for film formation, the epoxy resins were used as a curing system for curing reaction, and the conductive particles were used as fillers for imparting conductivity to the anisotropic conductive film.

The DSC exothermic peak temperature of each of the epoxy resins was measured using Model Q20 (TA Instruments) at 10° C./min with respect to an epoxy resin composition prepared by adding 5 wt % of the cationic curing catalyst SI-B2A to 95 wt % of the first or second epoxy resin.

Then, the prepared composition for anisotropic conductive films was deposited onto a white release film, followed by volatilization of the solvent at 60° C. for 5 minutes in a dryer, thereby preparing a dried 16 μm thick anisotropic conductive film.

Example 2

An anisotropic conductive film was prepared in the same manner as in Example 1 except that 11 wt % of a propylene oxide-based epoxy resin (EP-4000S, Adeka, Japan), 14 wt % of a bisphenol A epoxy resin (JER834, Mitsubishi Chemical, Japan), and 10 wt % of a phthalate epoxy resin (EX721, Nagase, Japan) were used.

Example 3

An anisotropic conductive film was prepared in the same manner as in Example 1 except that 9 wt % of a propylene oxide-based epoxy resin (EP-4000S, Adeka, Japan), 11 wt % of a bisphenol A epoxy resin (JER834, Mitsubishi Chemical, Japan), and 15 wt % of a phthalate epoxy resin (EX721, Nagase, Japan) were used.

Comparative Example 1

An anisotropic conductive film was prepared in the same manner as in Example 1 except that 23 wt % of a propylene oxide-based epoxy resin (EP-4000S, Adeka, Japan), 0 wt % of a bisphenol A epoxy resin (JER834, Mitsubishi Chemical, Japan), and 12 wt % of a phthalate epoxy resin (EX721, Nagase, Japan) were used.

Comparative Example 2

An anisotropic conductive film was prepared in the same manner as in Example 1 except that 35 wt % of a propylene oxide-based epoxy resin (EP-4000S, Adeka, Japan) was used and the bisphenol A epoxy resin (JER834, Mitsubishi Chemical, Japan) and the phthalate epoxy resin (EX721, Nagase, Japan) were not used.

Experimental Example

DSC Onset Temperature, Peak Temperature, Heat Quantity Variation Rate and Connection Resistance of Anisotropic Conductive Film The DSC onset temperature, peak temperature, heat quantity variation rate and connection resistance of each of the anisotropic conductive films prepared in Examples and Comparative Examples were measured by the following methods. Results are shown in Tables 2 and 3.

(1) DSC Onset Temperature and Peak Temperature

The DSC onset temperature was defined as temperature at a time point at which the slope of the DSC graph was increased for the first time due to heat generation upon measurement of heat quantity with respect to an adhesive layer of an anisotropic conductive film using a differential scanning calorimeter Model Q20 (TA Instruments) at a rate of 10° C./min in a temperature range from 0° C. to 300° C. under a nitrogen atmosphere. In addition, the peak temperature was defined as a temperature at a time point at which heat quantity reaches a maximum point in the DSC graph.

(2) Heat Quantity Variation Rate after being Left at 25° C. for 170 Hours

After 1 mg of each of an initial anisotropic conductive film and an anisotropic conductive film left at 25° C. for 170 hours was taken as a specimen, initial heat quantity ($H_0$) of the initial film and heat quantity ($H_1$) of the film left at 25° C. for 170 hours were measured in a temperature zone from −50° C. to 250° C. at 10° C./min using Model Q20 (TA Instruments) at 25° C. Then, the heat quantity variation rate was calculated by calculating variation of heat quantity of the film left for 170 hours to heat quantity of the initial film in percent.

(3) Connection Resistance after being Left at 25° C. for 170 Hours

To determine electrical characteristics of an anisotropic conductive film, a glass substrate having a bump area of 1200 μm$^2$ and a 2000 Å thick indium tin oxide (ITO) circuit, and an IC chip having a bump area of 1200 μm$^2$ and a thickness of 1.5 mm were placed on upper and lower surfaces of the anisotropic conductive film, followed by compression and heating under conditions of 150° C. and 70 Mpa for 5 seconds, thereby preparing a specimen of the anisotropic conductive film. Then, initial connection resistance of the specimen was measured by a 4-probe method using a resistance tester Model 2000 multimeter (Keithley Co., Ltd.) by applying a test current of 1 mA. In addition, after being left at 25° C. for 170 hours, the anisotropic conductive film was subjected to compression and heating under the same conditions to prepare a specimen, followed by measuring connection resistance of the specimen in the same manner.

TABLE 2

| | Conditions | Example 1 | Example 2 | Example 3 | Comparative Example 1 | Comparative Example 2 |
|---|---|---|---|---|---|---|
| Initial | Onset (° C.) | 64 | 69 | 86 | 60 | 52 |
| | Peak (° C.) | 90 | 97 | 108 | 87 | 82 |
| After being left at 25° C. for 170 hours | Onset (° C.) | 71 | 75 | 91 | 65 | 59 |
| | Peak (° C.) | 103 | 109 | 116 | 95 | 91 |
| | Heat quantity variation rate (%) | 32 | 17 | 14 | 43 | 65 |

TABLE 3

| 150° C./70 MPa | Example 1 | Example 2 | Example 3 | Comparative Example 1 | Comparative Example 2 |
|---|---|---|---|---|---|
| Initial connection resistance (Ω) | 0.1 | 0.1 | 2.4 | 0.1 | 0.1 |
| Connection resistance (Ω) after being left at 25° C. for 170 hours | 5.2 | 3.1 | 4.5 | X | X |

In Tables 2 and 3, the anisotropic conductive films of Examples 1 to 3 had a DSC onset temperature in the range of 62° C. to 90° C. and a peak temperature in the range of 85° C. to 120° C., and thus permitted rapid curing at low temperature. The anisotropic conductive films of Examples 1 to 3 had a heat quantity variation rate of 35% or less and thus exhibited good storage stability. On the other hand, the anisotropic conductive film of Comparative Example 1, which employed much less than 60 parts by weight or less of the second epoxy resin based on the total amount of the epoxy resins, and the anisotropic conductive film of Comparative Example 2, which did not employ the second epoxy resin, had a heat quantity variation rate of 35% or higher causing deterioration in storage stability. Further, deterioration in connection property of the anisotropic conductive film after being left at 25° C. for 170 hours appeared, such that it was hard to measure the connection resistance.

By way of summation and review, anisotropic conductive adhesives containing epoxy resins are desirable to secure electrical connection between the circuit boards and to allow rapid curing at relatively low temperature in order to prevent thermal damage to the circuit boards.

A composition of such an anisotropic conductive adhesive is made up of a cation-polymerizable epoxy resin composition. The cation-polymerizable epoxy resin composition generally includes a cationic curing catalyst that generates protons by heat and light to cause cationic polymerization. Sulfonium antimonate complexes are known as such a cation curing catalyst. However, sulfonium antimonate complexes have, as a counter anion, $SbF_6^-$, in which fluorine atoms are bonded to metal antimony, such that fluorine ions are generated in large amounts and migration of heterogeneous metals occurs during cationic polymerization, thereby causing corrosion of metal wires or connection pads. Accordingly, it would be desirable to have various cationic curing catalysts that do not have corrosion issues while exhibiting reactivity enabling rapid curing at low temperature. In addition, compositions that provide rapid curing at low temperature may have issues of short storage stability and improvements in stability are desirable.

Embodiments provide a semiconductor device connected by an anisotropic conductive film that allows rapid curing at low temperature upon thermal preliminary pressing and exhibits sufficient stability while securing excellent connection properties after bonding. For example, the semiconductor device according to embodiments allows rapid curing at a low temperature of 100° C. to 150° C. and exhibits sufficient stability while securing excellent connection properties after bonding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A semiconductor device connected by an anisotropic conductive film, wherein the anisotropic conductive film has a heat quantity variation rate of about 35% or less, as measured by differential scanning calorimetry (DSC) and calculated according to the following Equation 1:

Heat quantity variation rate (%)=$[(H_0-H_1)/H_0]\times100$,    [Equation 1]

where $H_0$ is heat quantity of the anisotropic conductive film as measured by DSC after being left at 25° C. for 0 hour and $H_1$ is heat quantity of the anisotropic conductive film as measured by DSC after being left at 25° C. for 170 hours.

2. The semiconductor device as claimed in claim 1, wherein the anisotropic conductive film includes an epoxy resin having an exothermic peak temperature of about 120° C. to about 200° C. as measured by differential scanning calorimetry (DSC).

3. The semiconductor device as claimed in claim 1, wherein the anisotropic conductive film includes a first epoxy resin having an exothermic peak temperature of about 80° C. to about 110° C. and a second epoxy resin having an exothermic peak temperature of about 120° C. to about 200° C., as measured by differential scanning calorimetry (DSC).

4. The semiconductor device as claimed in claim 3, wherein the first epoxy resin includes one or more of a propylene oxide-based epoxy resin, a hydrogenated bisphenol A epoxy resin, a cycloaliphatic epoxy resin or a naphthalene epoxy resin.

5. The semiconductor device as claimed in claim 3, wherein the second epoxy resin includes one or more of a bisphenol A epoxy resin, a novolac epoxy resin, a phthalate epoxy resin or a biphenyl epoxy resin.

6. The semiconductor device as claimed in 3, wherein the second epoxy resin is present in an amount of about 60 to about 90 parts by weight based on 100 parts by weight of the first and second epoxy resins.

7. The semiconductor device as claimed in claim 1, wherein the anisotropic conductive film has an DSC onset temperature of about 62° C. to about 90° C. and a peak temperature of about 85° C. to about 120° C.

8. The semiconductor device as claimed in claim 1, wherein the anisotropic conductive film includes a cationic curing catalyst represented by Formula 1;

[Formula 1]

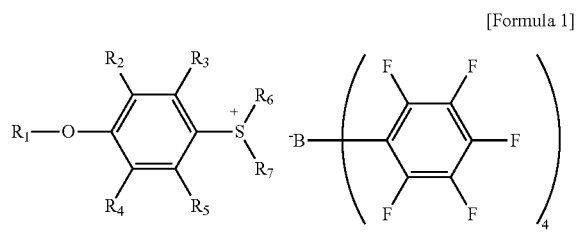

wherein:

$R_1$ to $R_5$ are each independently a hydrogen atom, a substituted or unsubstituted $C_1$ to $C_6$ alkyl group, an acetyl group, an alkoxycarbonyl group, a benzoyl group or a benzyloxycarbonyl group, and $R_6$ and $R_7$ are each independently an alkyl group, a benzyl group, an o-methylbenzyl group, an m-methylbenzyl group, a p-methylbenzyl group, or a naphthylmethyl group.

9. The semiconductor device as claimed in any one of claim 1, wherein the anisotropic conductive film provides a connection resistance of about 3Ω or less, as measured at 25° C. immediately after compressing and heating the anisotropic conductive film placed between a glass substrate including electrodes and an IC driver chip or IC chip at 140° C. to 160° C. under a load of 60 MPa to 80 MPa for 3 to 7 seconds, and a connection resistance of about 7Ω or less, as measured after compressing and heating the anisotropic conductive film, which has been left at 25° C. for 170 hours and then placed between the glass substrate including electrodes and the IC driver chip or IC chip, under conditions of 140° C. to 160° C. and a load of 60 MPa to 80 MPa for 3 to 7 seconds.

10. A semiconductor device connected by an anisotropic conductive film, wherein:

the anisotropic conductive film includes a composition including a first epoxy resin having an exothermic peak temperature of about 80° C. to about 110° C. and a second epoxy resin having an exothermic peak temperature of about 120° C. to about 200° C., as measured by differential scanning calorimetry (DSC), the first epoxy resin and the second epoxy resin are present in combined amount of about 30 wt % to about 50 wt % based on a total weight of the composition in terms of solid content, and the second epoxy resin is present in an amount of about 60 to about 90 parts by weight based on 100 parts by weight of the first and second epoxy resins.

11. The semiconductor device as claimed in claim 10, wherein the composition further includes a binder resin, a cationic curing catalyst, and conductive particles.

12. The semiconductor device as claimed in claim 10, wherein the composition further includes about 30 wt % to about 70 wt % of a binder resin, about 1 wt % to about 15 wt % of a cationic curing catalyst, and about 1 wt % to about 25 wt % of conductive particles based on a total weight of the composition in terms of solid content.

13. The semiconductor device as claimed in claim 10, wherein the composition for anisotropic conductive films further includes a stabilizer.

14. The semiconductor device as claimed in claim 13, wherein the stabilizer includes one or more of a sulfonium, an amine, a phenol, a crown ester, a phosphine, or a triazine.

* * * * *